United States Patent
Smirnov

(10) Patent No.: US 7,839,487 B2
(45) Date of Patent: Nov. 23, 2010

(54) OPTICAL SYSTEM FOR INCREASING ILLUMINATION EFFICIENCY OF A PATTERNING DEVICE

(75) Inventor: Stanislav Y. Smirnov, Bethel, CT (US)

(73) Assignee: ASML Holding N.V., Veldhoven (NL)

( * ) Notice: Subject to any disclaimer, the term of this patent is extended or adjusted under 35 U.S.C. 154(b) by 800 days.

(21) Appl. No.: 11/403,007

(22) Filed: Apr. 13, 2006

(65) Prior Publication Data
US 2007/0241292 A1 Oct. 18, 2007

(51) Int. Cl.
G03B 27/54 (2006.01)

(52) U.S. Cl. .......................................... 355/67

(58) Field of Classification Search .................. 355/67, 355/75, 53
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,333,035 A * | 7/1994 | Shiraishi | 355/77 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,775,069 B2 | 8/2004 | Oskotsky et al. | |
| 6,795,169 B2 | 9/2004 | Tanaka et al. | |
| 6,806,897 B2 | 10/2004 | Kataoka et al. | |

(Continued)

FOREIGN PATENT DOCUMENTS

JP 11-271650 A 10/1999

(Continued)

OTHER PUBLICATIONS

Notification of Reason(s) for Refusal, Japanese Patent Application No. 2007-105001, drafted Jul. 16, 2010.
U.S. Appl. No. 12/827,490, filed Jun. 30, 2010.

*Primary Examiner*—Peter B Kim
*Assistant Examiner*—Chia-how Michael Liu
(74) *Attorney, Agent, or Firm*—Sterne, Kessler, Goldstein & Fox P.L.L.C.

(57) ABSTRACT

A system and method form illumination that efficiently illuminates target areas of an object. For example, target areas can be transmission areas of a diaphragm and/or active areas of a patterning device. A plurality of beams formed by a field defining element are directed onto respective entrance faces of a plurality of rods using a relay of first and second lens arrays. The rods process the beams to form illumination that impinges substantially only within a boundary of the target areas, e.g., the transmission areas and/or the active areas. The rods are arranged in number, configuration, and cross-sectional shape corresponding to a number, configuration, and a cross-sectional shape of the target areas, e.g., the transmission areas and/or the active areas. Thus, substantially all the illumination falls within the boundary of the target areas, increasing illumination efficiency.

23 Claims, 12 Drawing Sheets

U.S. PATENT DOCUMENTS

| | | |
|---|---|---|
| 6,811,953 B2 | 11/2004 | Hatada et al. |
| 6,813,003 B2 | 11/2004 | Oskotsky et al. |
| 7,006,295 B2 | 2/2006 | Coston et al. |
| 7,079,321 B2 | 7/2006 | Coston et al. |
| 7,187,430 B2 | 3/2007 | Oskotsky et al. |
| 2004/0041104 A1 | 3/2004 | Liebregts et al. |
| 2004/0130561 A1 | 7/2004 | Jain |
| 2005/0007572 A1 | 1/2005 | George et al. |
| 2007/0183054 A1 | 8/2007 | Ryzhikov et al. |

FOREIGN PATENT DOCUMENTS

| | | |
|---|---|---|
| JP | 2004-266198 A | 9/2004 |
| WO | WO 98/33096 | 7/1998 |
| WO | WO 98/38597 | 9/1998 |

\* cited by examiner

OPTICAL SYSTEM FOR INCREASING ILLUMINATION EFFICIENCY OF A PATTERNING DEVICE

BACKGROUND

1. Field of the Invention

The present invention relates to illumination optical systems.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Illumination efficiency is an important parameter in maskless lithography, for example with regards to illuminating a diaphragm placed before a patterning device or illuminating the patterning device itself. A surface of the diaphragm or patterning device may only be comprised of 10-15% transmission areas or active areas, respectively, which should be illuminated, while having 85-90% non-transmission or inactive areas that should not be illuminated. Illuminating non-transmission or inactive areas unnecessarily uses up illuminating resources and can cause spurious reflections and stray light, which can interfere with and affect the characteristics of a patterned beam.

What is needed is a system and method that more efficiently illuminates a diaphragm and/or a patterning device, for example substantially only within a boundary of transmission areas of a diaphragm and/or active areas of a patterning device.

SUMMARY

In one embodiment of the present invention, there is provided an optical system comprising an optical element, a relay, a plurality of rods, and an object. The optical element receives a beam and generates a plurality of beams therefrom. The relay comprises first and second lens arrays. Each lens in the first lens array receives a respective portion of the plurality of beams and directs the respective portion onto a corresponding lens in the second lens array. Each of the rods receives a beam from a corresponding lens in the second lens array. The plurality of rods corresponds in number and arrangement to the lenses in the second lens array. The object includes a plurality of target areas corresponding in number and shape to a number and a cross-sectional shape of the rods. Each of the target areas receives a beam from a corresponding one of the rods substantially within a boundary of the target area.

In another embodiment of the present invention, there is provided a lithography system comprising a radiation source, an illumination system, a patterning device, and a projection system. The radiation source produces a beam of radiation. The illumination system processes the beam of radiation to produce a plurality of beams of radiation. The illumination system comprises a pupil defining element, a condenser lens, a field defining element, a first relay comprising first and second lens arrays, a plurality of rods, a diaphragm having transmission areas, and a second relay. The patterning device patterns the plurality of beams of radiation. The projection system projects the patterned beams onto a substrate.

In a further embodiment of the present invention, there is provided a method comprising the steps of: generating a plurality of beams of radiation using an optical element; receiving the beams on respective lenses in a first lens array; using the first lens array to direct the beams onto corresponding lenses in a second lens array; using the second lens array to direct the beams onto corresponding rods in a plurality of rods, which correspond in number and arrangement to lenses in the second lens array; and using the plurality of rods to direct the beams substantially within a boundary area of corresponding target areas of an object, where the object includes a plurality of the target areas. The plurality of the target areas correspond in number and shape to the number and a cross-sectional shape of the rods in the plurality of rods.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
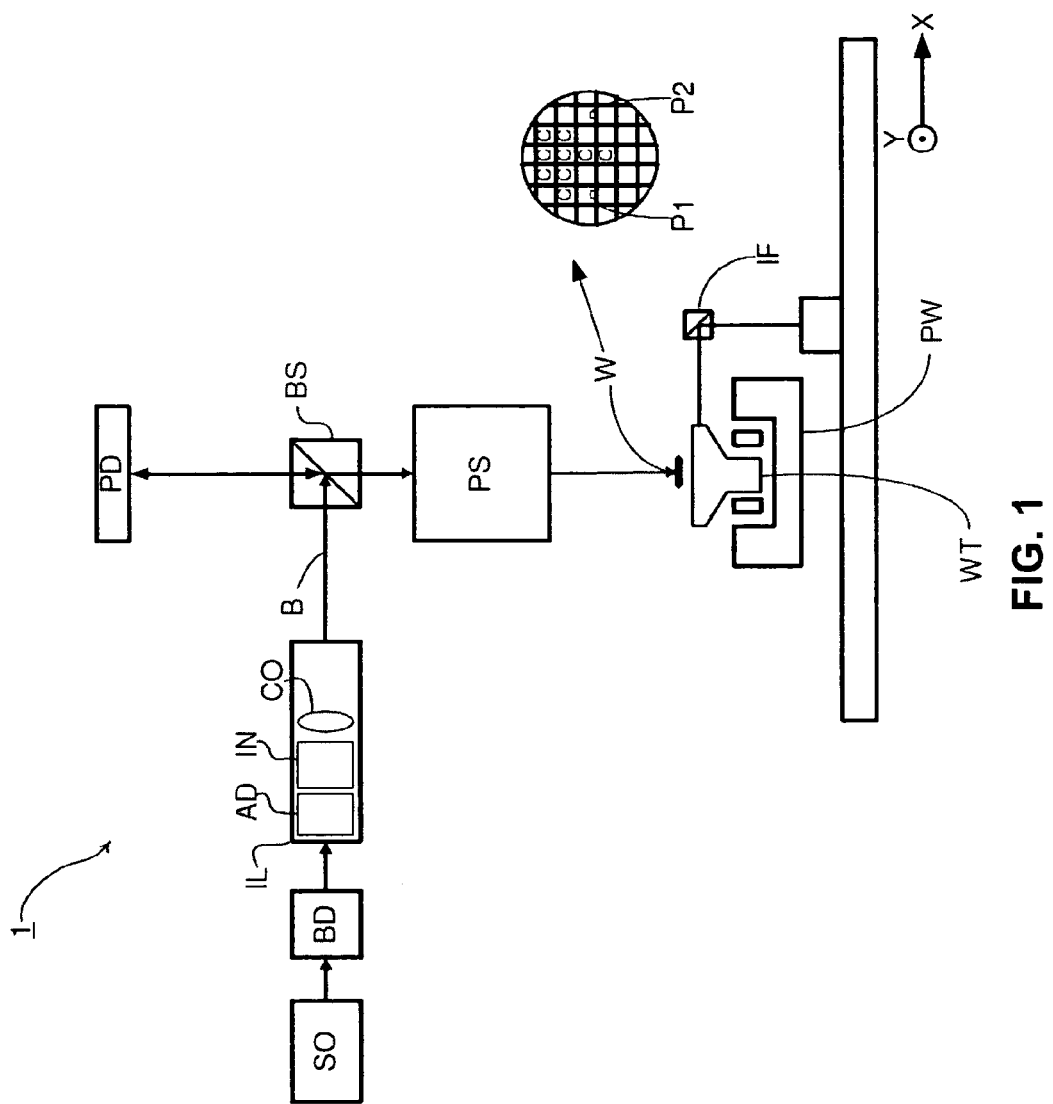
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

In one or more embodiments, a system and method are used to form illumination that efficiently illuminates target areas of an object. For example, target areas can be transmission areas of a diaphragm and/or active areas of a patterning device. A plurality of beams formed by a field defining element are directed onto respective entrance faces of a plurality of rods using a relay of first and second lens arrays. The rods process the beams to form illumination that impinges substantially only within a boundary of the target areas, e.g., the transmission areas and/or the active areas. The number, configuration, and cross-sectional shape of the rods corresponds to the number, configuration, and a cross-sectional shape of the target areas, such as the transmission areas and/or the active areas. Thus, substantially all the illumination falls within the boundary of the target areas, increasing illumination efficiency.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. The thickness of the substrate may be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
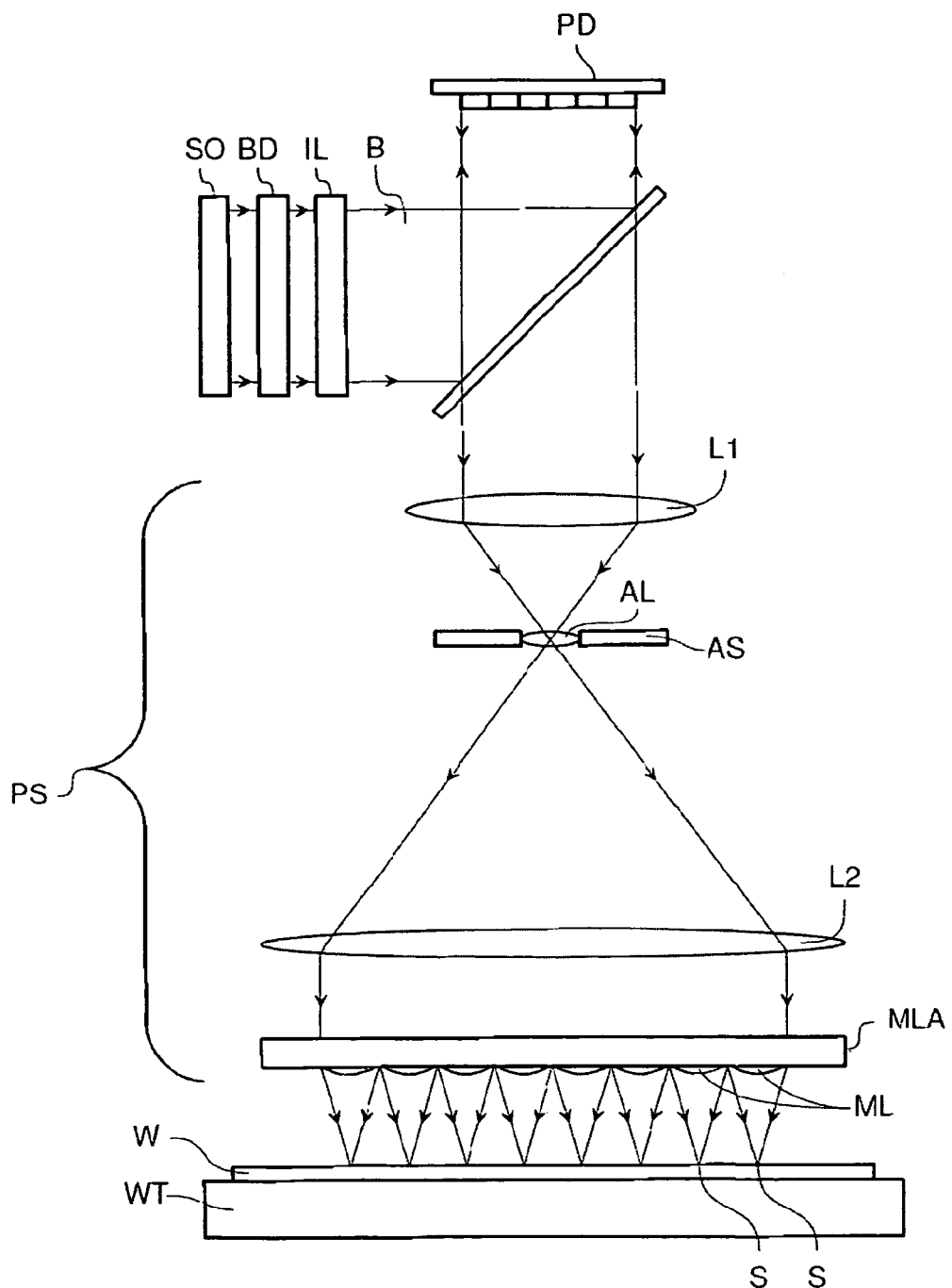

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
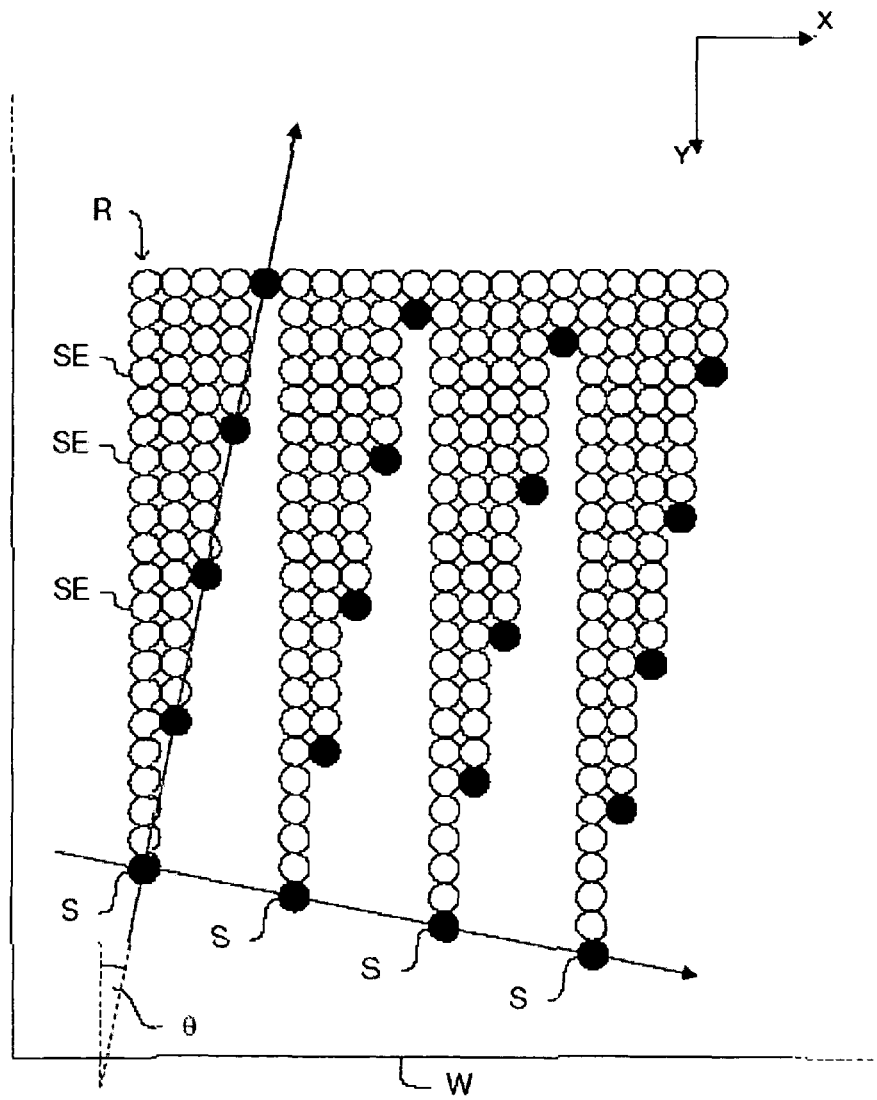
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
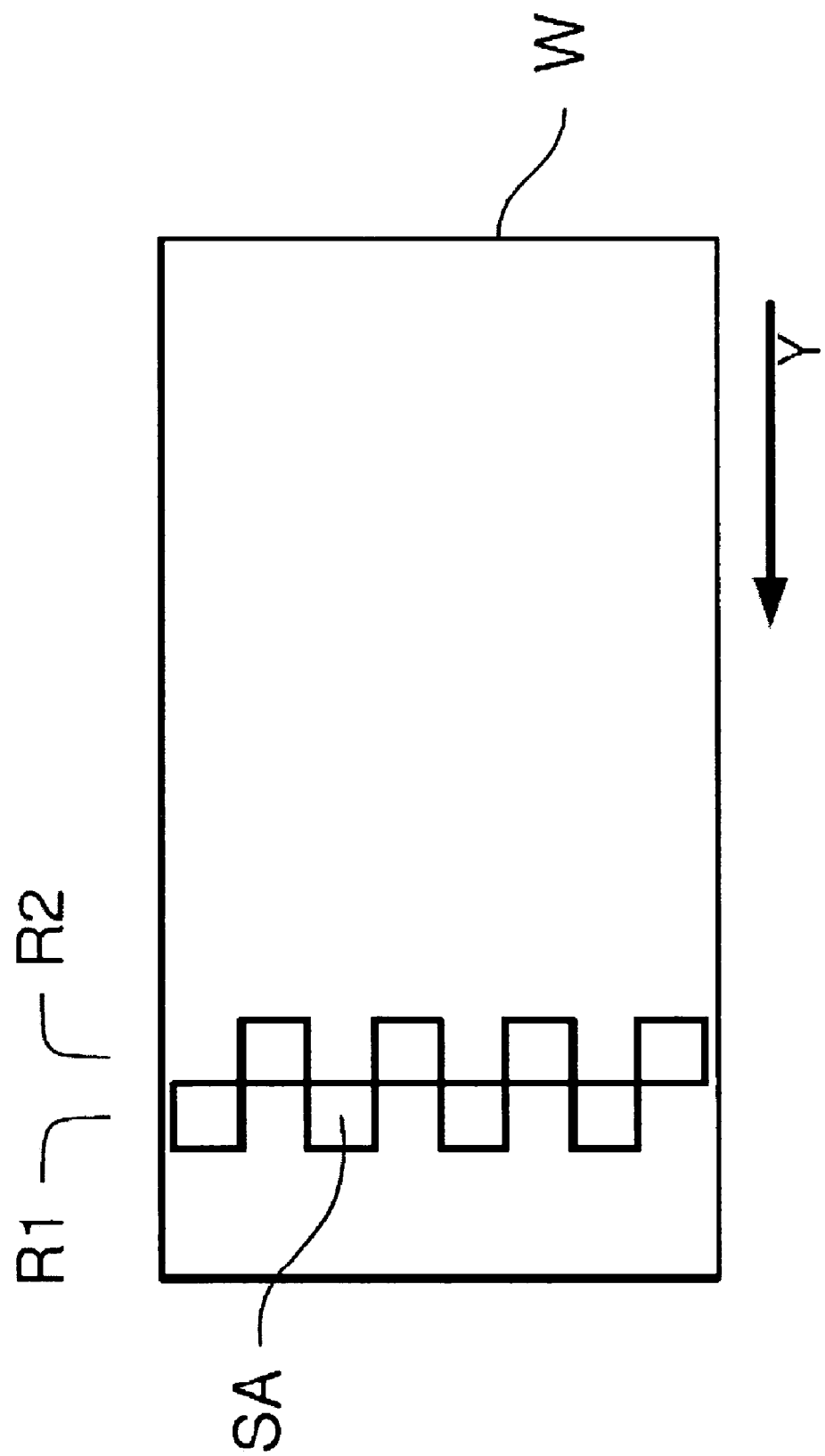
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
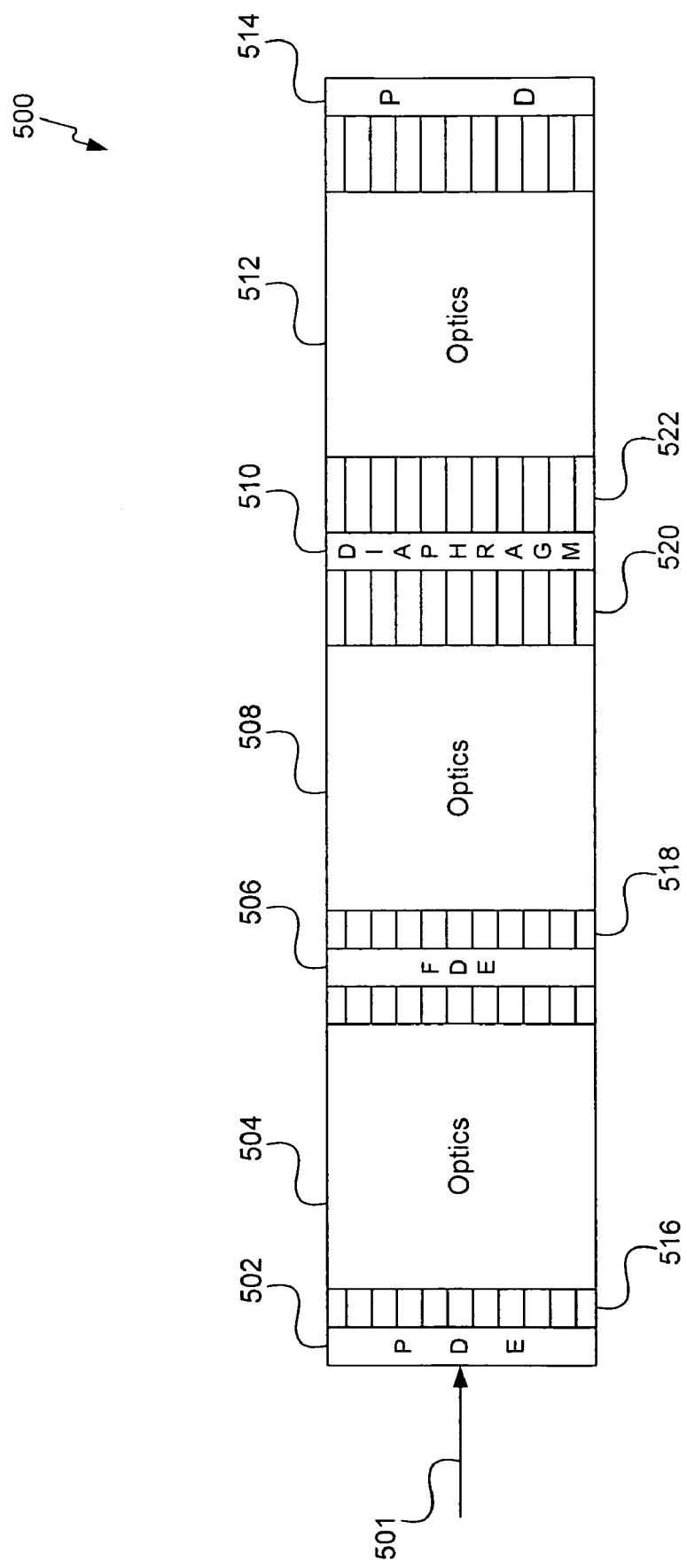
FIGS. 5 and 6 show exemplary illumination systems, according to various embodiments of the present invention.
Figure 6:
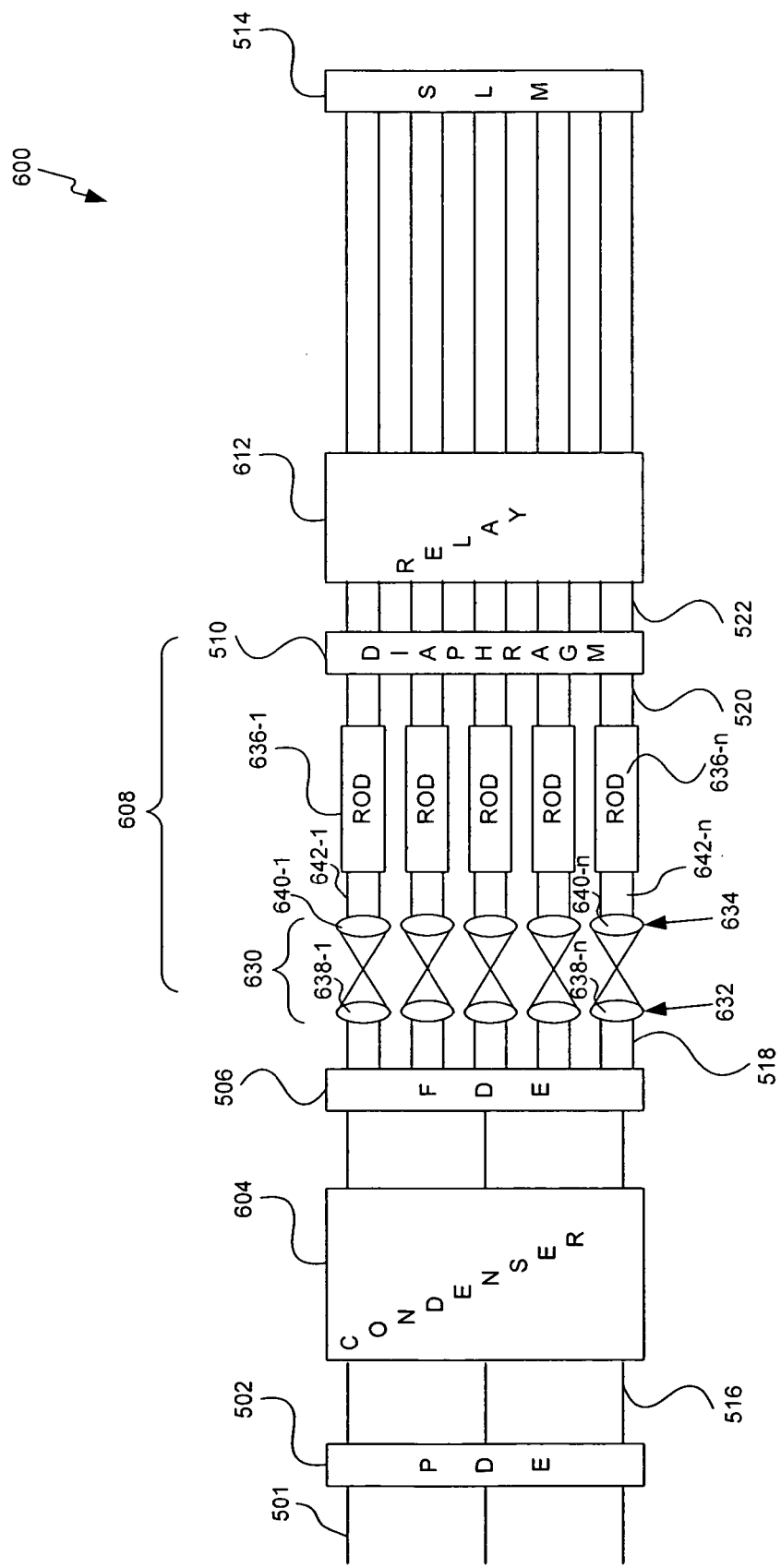

FIGS. 5 and 6 show exemplary illumination systems 500 and 600, respectively, according to various embodiments of the present invention. In one example, illumination systems 500 and/or 600 can be used in place of illumination system IL.

Illumination system 500 comprises a pupil defining element 502 (PDE), optics 504, a field defining element 506 (FDE), optics 508, a diaphragm 510, optics 512, and a patterning device 514 (PD). It is to be appreciated that optics 504, 508, and 512 can include one or more optical devices based on the desired application of illumination system 500.

Pupil defining element 502 receives a beam of radiation 501 from a light source (not shown, see, e.g., in FIG. 1 radiation source SO) and forms a plurality of beams 516 therefrom. In various examples, pupil defining element 502 can be a diffractive or refractive element. Field defining element 506 receives beams 516 and forms a plurality of beams 518 therefrom. In various examples, field defining element 506 can be a diffractive or refractive element. Optics 508 processes beams 518 to produce beams 520, which are directed onto diaphragm 510. In one example, diaphragm 510 can include transmission areas (see elements 850 in FIG. 8) that are arranged and shaped to correspond to active areas (see elements 852 in FIG. 8) on patterning device 514. Light passing through diaphragm 510 forms beams 522. Optics 512 processes beams 522 to produce beams 524, which are directed onto, for example, the active areas of patterning device 514.

In one example, patterning device 514 is a dynamic patterning device including an array of individually programmable elements (i.e., active areas), such as those described above with regards to FIG. 1.

Alternatively, as shown in FIG. 6, an illumination system 600 includes similar elements to FIG. 5, except optics 504, 508, and 512 are replaced with a condenser 604, an optical system 608, and a relay 612. Optical system 608 includes a relay 630, which has a first lens array 632 and a second lens array 634, and a plurality of rods 636-1 to 636-$n$ ($n$ being a positive integer greater than 1). Respective portions of light beams 518 are received by lenses 638-1 to 638-$n$ in first lens array 632, which direct light onto corresponding lenses 640-1 to 640-$n$ in second lens array 634. Although five lenses 638 and 640 are shown, any number can be used based on desired application of system 600. In one example, beams 518 are demagnified by relay 630, as described below with respect to FIG. 7. Light beams 642-1 to 642-$n$ are directed from respective lenses 640-1 to 640-$n$ onto corresponding rods 636-1 to 636-$n$. In various examples, rods 636 can be either solid glass rods, hollow rods with reflective interior walls, or the like. It is to be appreciated that other rod configurations can also be used.

In various examples, first and second lens arrays 632 and 634, respectively, can be fly's eye lens arrays or micro lens arrays. Additionally or alternatively, relay 630 is configured to maintain double telecentricity of beams 518.

It is to be appreciated the number of rods and lenses shown in FIGS. 5 and 6, and also with respect to FIGS. 7 and 8 discussed below, is for illustrative purposes only, and any number of rods or lenses can be used based on a desired application.

In one example, a length of rods 636 is chosen to allow for a predetermined number of reflections within the rods 636, such that irradiance at the exit faces of rods 636 is uniform, for example as shown and described with respect to FIGS. 9 and 10 below.

A more detailed description regarding the elements of FIGS. 5 and/or 6 can be found, for example, in co-owned U.S. Pat. Nos. 6,813,003 and 6,775,069 and co-owned, co-pending U.S. application Ser. Nos. 10/896,022, 10/808,436, 10/812, 978, and 11/347,282, which are all incorporated by reference herein in their entireties.

Figure 7:
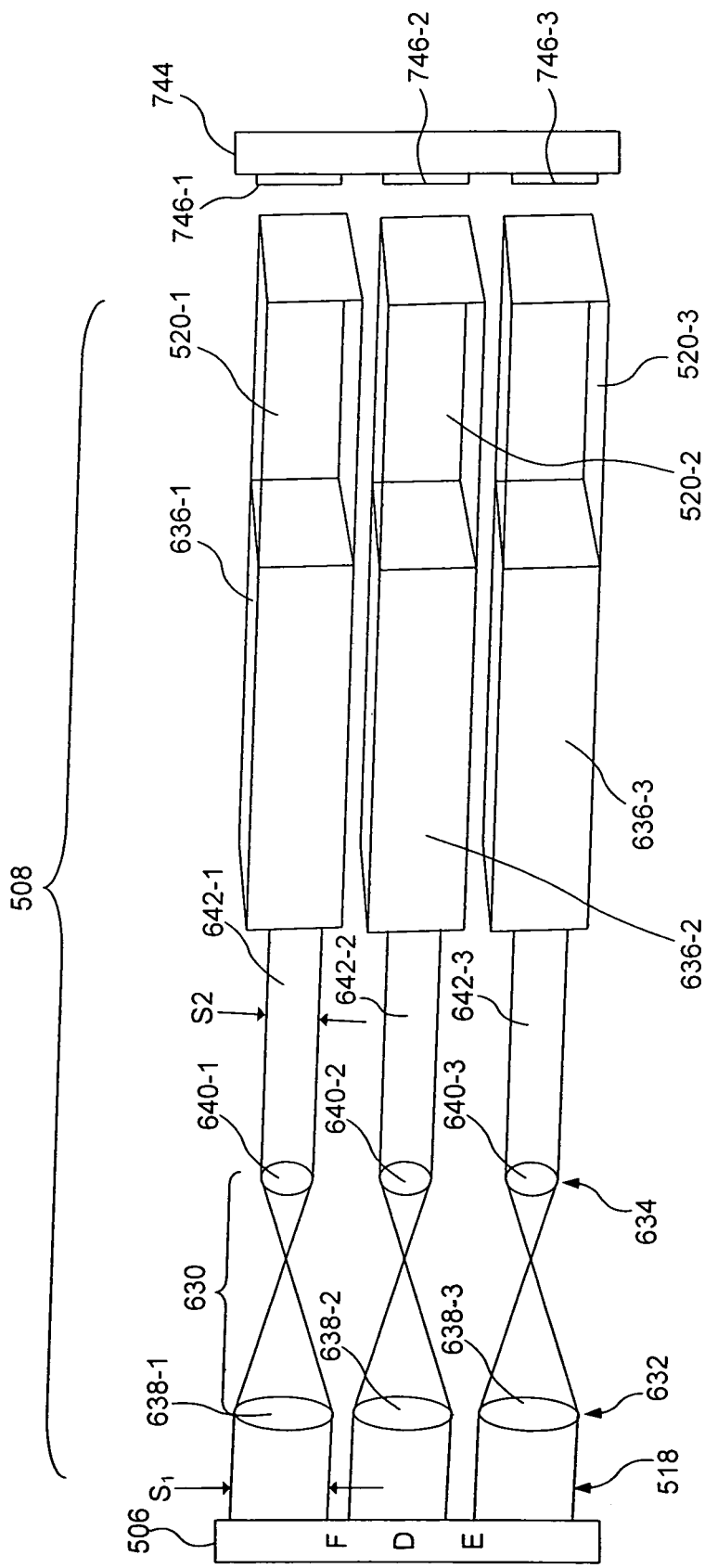
FIG. 7 shows a light path from a field defining element, through rods, and onto an object, according to one embodiment of the present invention.

FIG. 7 shows a light path from a field defining element 506, through rods 636-1 to 636-3, and onto target areas 746-1 to 746-3 of an object 744, according to one embodiment of the present invention. In various examples, object 744 can be either a diaphragm (e.g., diaphragm 510) or a patterning device (e.g., patterning device 514), and target areas 746 can be transmission areas or active areas, respectively. Thus, in one embodiment diaphragm 510 and relay 612 may be removed. In this embodiment, respective beams 520-1 to 520-3 exiting rods 636-1 to 636-3 can be directed directly onto corresponding active areas 746 of patterning device 514.

Alternatively or additionally, beams 518 can have a first size S1, while beams 642 can have a second size S2, which is smaller than S1. This reduction in size is a result of a demagnification of light beam 518 produced by light passing through relay 630. For example, lenses 638 have a first diameter related to S1, while lenses 640 have a second, relatively smaller diameter related to S2. Thus, as beams 518 are directed from lenses 638 through lenses 640, a cross-sectional size of beams 518 is reduced to form beams 642. Lenses 638 and 640 create images of the field defining element 506 on or close to a plane of entrance faces of rods 636.

Figure 8:
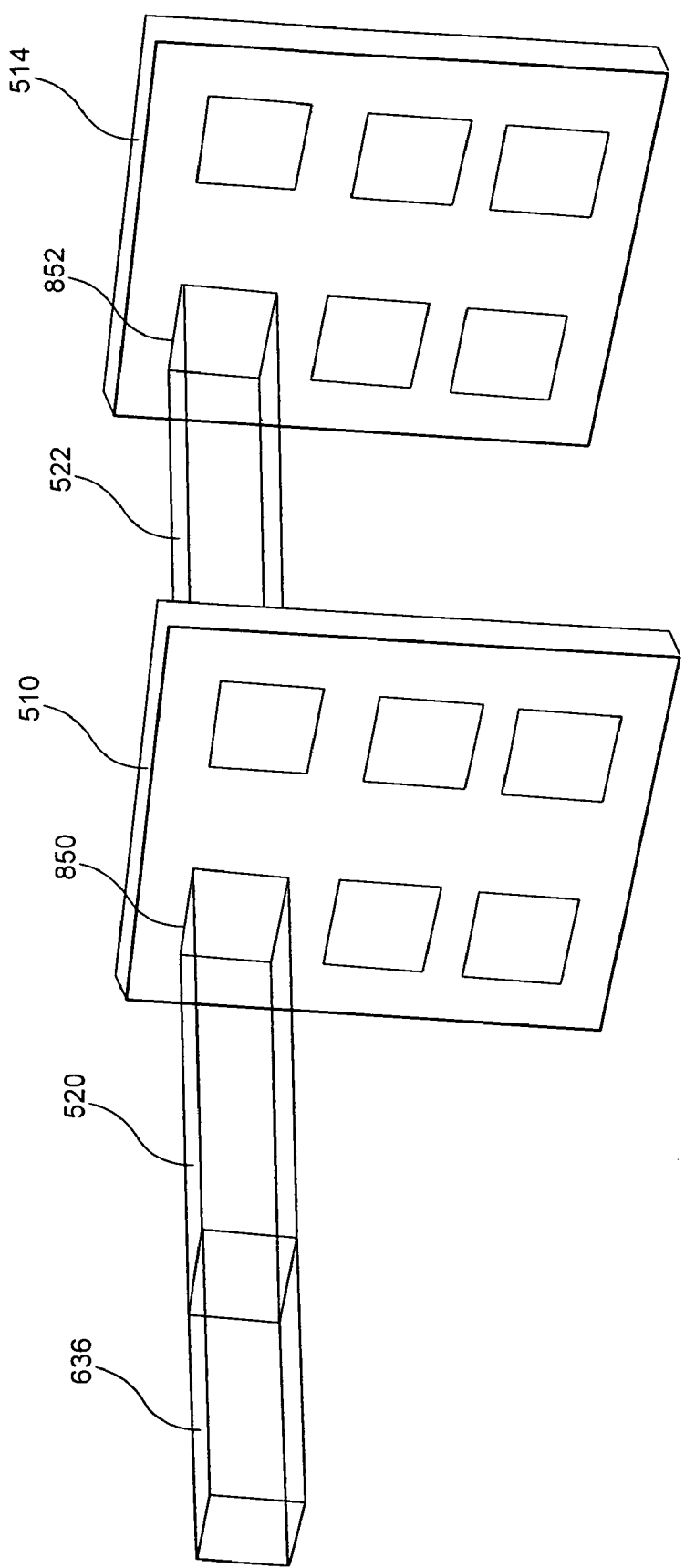
FIG. 8 shows a light path for light exiting a plurality of rods, passing through a diaphragm and a relay, and impinging on active areas of a patterning device, according to one embodiment of the present invention.

FIG. 8 shows a light path for light exiting rod 636, passing through transmission area 850 in diaphragm 510, and impinging on active area 852 of a patterning device 514, according to one embodiment of the present invention. In FIG. 8, optics 512 and/or relay 612 are not shown for convenience of illustration, but may be located between diaphragm 510 and patterning device 514 as shown in FIGS. 5 and 6.

In the examples shown in FIGS. 7 and 8, rods 636 have a rectangular cross-section shape with an aspect ratio and shape substantially similar to target areas 746 in object 744, transmission areas 850 in diaphragm 510, and/or active areas 852 in patterning device 514. Thus, when object 744 is a diaphragm (e.g., diaphragm 510), rods 636 form beams 520 shaped to fall substantially within a boundary of transmission areas 850 in diaphragm 510. Alternatively, when object 744 is a patterning device (e.g., patterning device 514), rods 636 form beams 520 shaped to fall substantially within a boundary of active areas 852 of patterning device 514. In one example, object 744 is located close to exit faces of rods 636. In this example, target areas 746 are illuminated uniformly because the exit faces of rods 636 due to multiple reflections within rods 636, as discussed with respect to FIGS. 9 and 10 below.

In one example, the arrangement of rods 636 is equal in number and configuration to lenses 640 in second lens array 634, target areas 746 in object 744, transmission areas 850 in diaphragm 510, and/or active areas 852 in patterning device 514.

It is to be appreciated other cross-sectional shapes for rods 636 can be used based on a shape of target areas 746, transmission areas 850, and/or active areas 852. For example, triangular, rhombic, hexagonal, etc. cross-sectional shapes can be used.

Alternatively or additionally, diaphragm 510 can be one of a: multiple aperture cleanup structure, an auxiliary multiple aperture forming element, a stencil mask, an intensity correcting multiple aperture element, or the like. Also, transmission areas 850 of diaphragm 510 may include one or more full or partial transmission areas, which can correspond in number and arrangement to active areas 852 on pattering device 514. Each transmission area 850 can have a gradual change in transmissivity across its width or from the center of its width outward in all directions. Alternatively or additionally, diaphragm 510 can be used to reduce or substantially eliminate undesirable scattered light from reaching patterning device 514.

Figure 9:
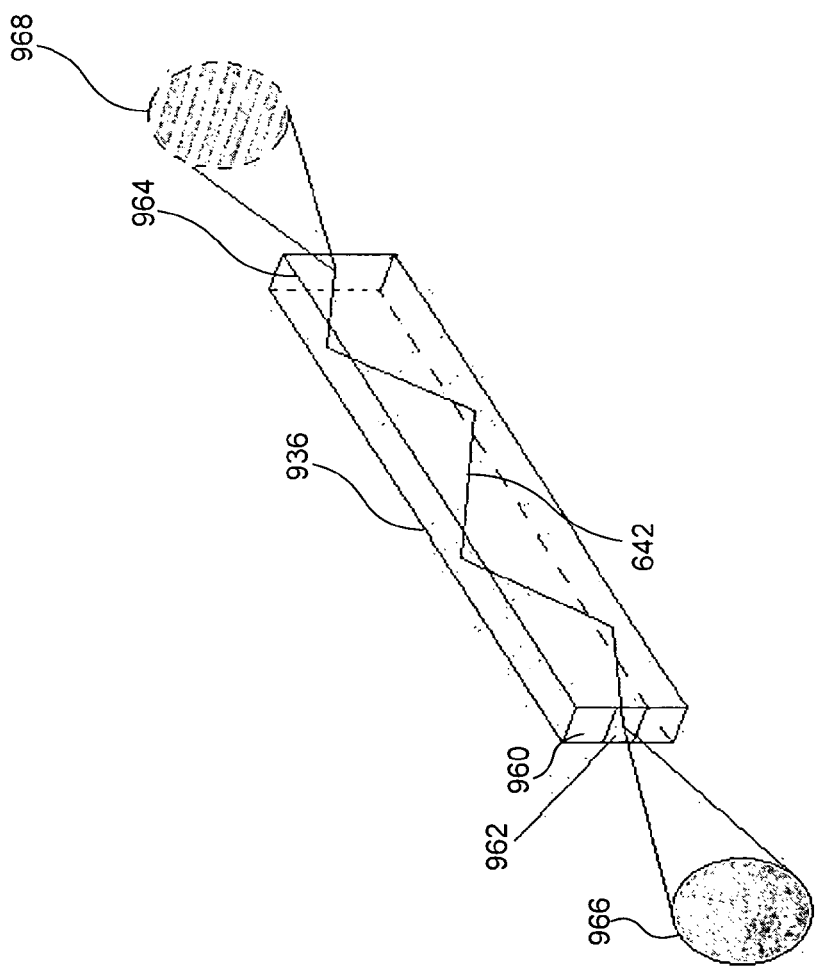
FIGS. 9 and 10 show illumination properties of rods, according to various embodiments of the present invention.

FIG. 9 shows illumination properties of a rod 936, according to one embodiment of the present invention. In one example, rod 936 can be used in place of rods 636 in FIGS. 6, 7, and 8. In this embodiment, a portion 962 of an entrance face 960 of rod 936 is illuminated, e.g., with beam 642. After reflecting through rod 936, beam 642 uniformly illuminates an exit face 964 of rod 936. Based on well-known optical principles, through the partial illumination of entrance face 960, i.e., at portion 962, an entrance pupil 966 of rod 936 is uniform, while an exit pupil 968 of rod 936 is stripped.

Figure 10:
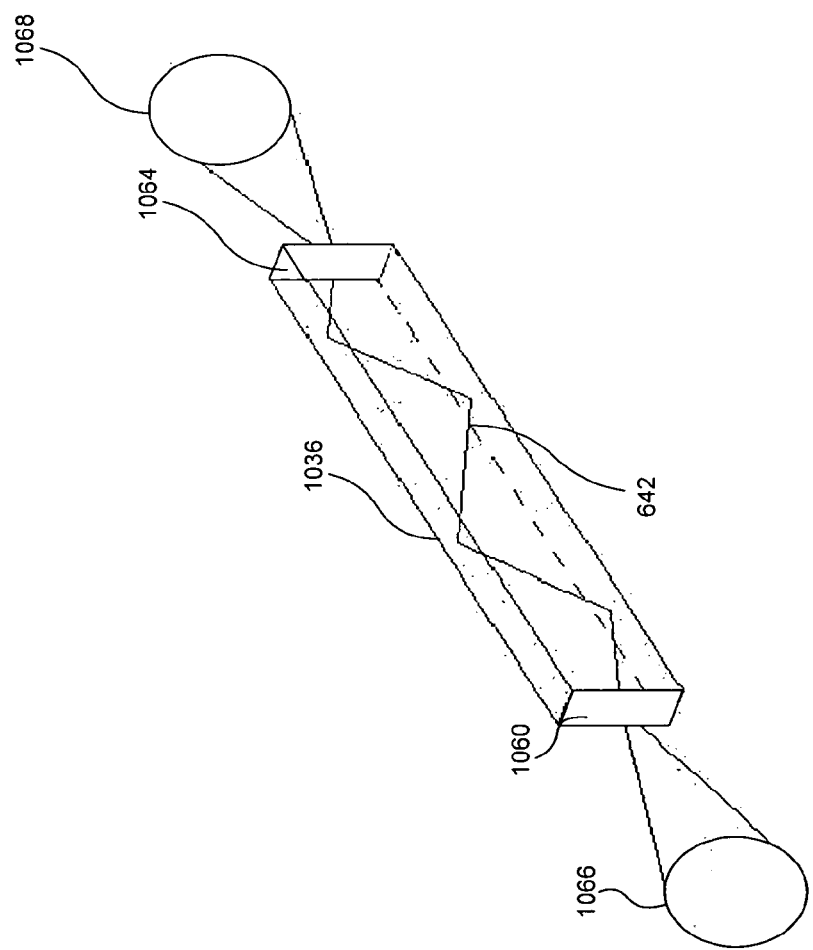

FIG. 10 shows illumination properties of a rod 1036, according to one embodiment of the present invention. In one example, rod 1036 can be used in place of rods 636 in FIGS. 6, 7, and 8. In this embodiment, an entrance face 1060 of rod 1036 is substantially completely illuminated, e.g., with beam 642. After reflecting through rod 1036, beam 642 uniformly illuminates an exit face 1064 of rod 1036. Based on well-known optical principles, through the substantially complete illumination of entrance face 1060, both an entrance pupil 1066 and an exit pupil 1068 of rod 1036 are uniformly illuminated.

Figure 11:
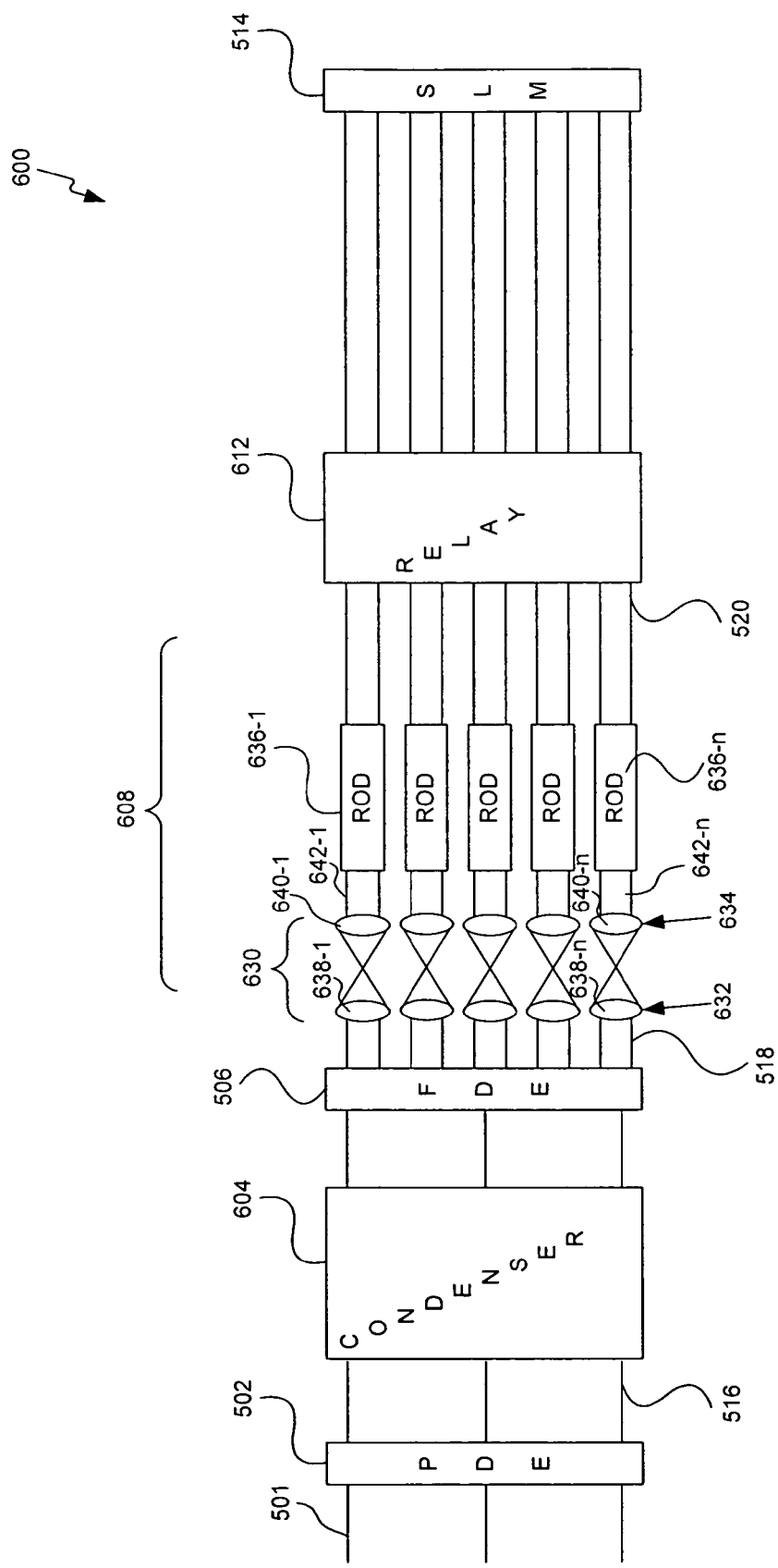
FIG. 11 is a flowchart depicting a method, according to one embodiment of the present invention.

FIG. 11 shows another embodiment of the present invention. In this embodiment, diaphragm 510 has been removed from system 600, such that beams 520 illuminate relay 612 directly. Relay 612 directs beams 520 onto corresponding active areas of patterning device 514.

Figure 12:
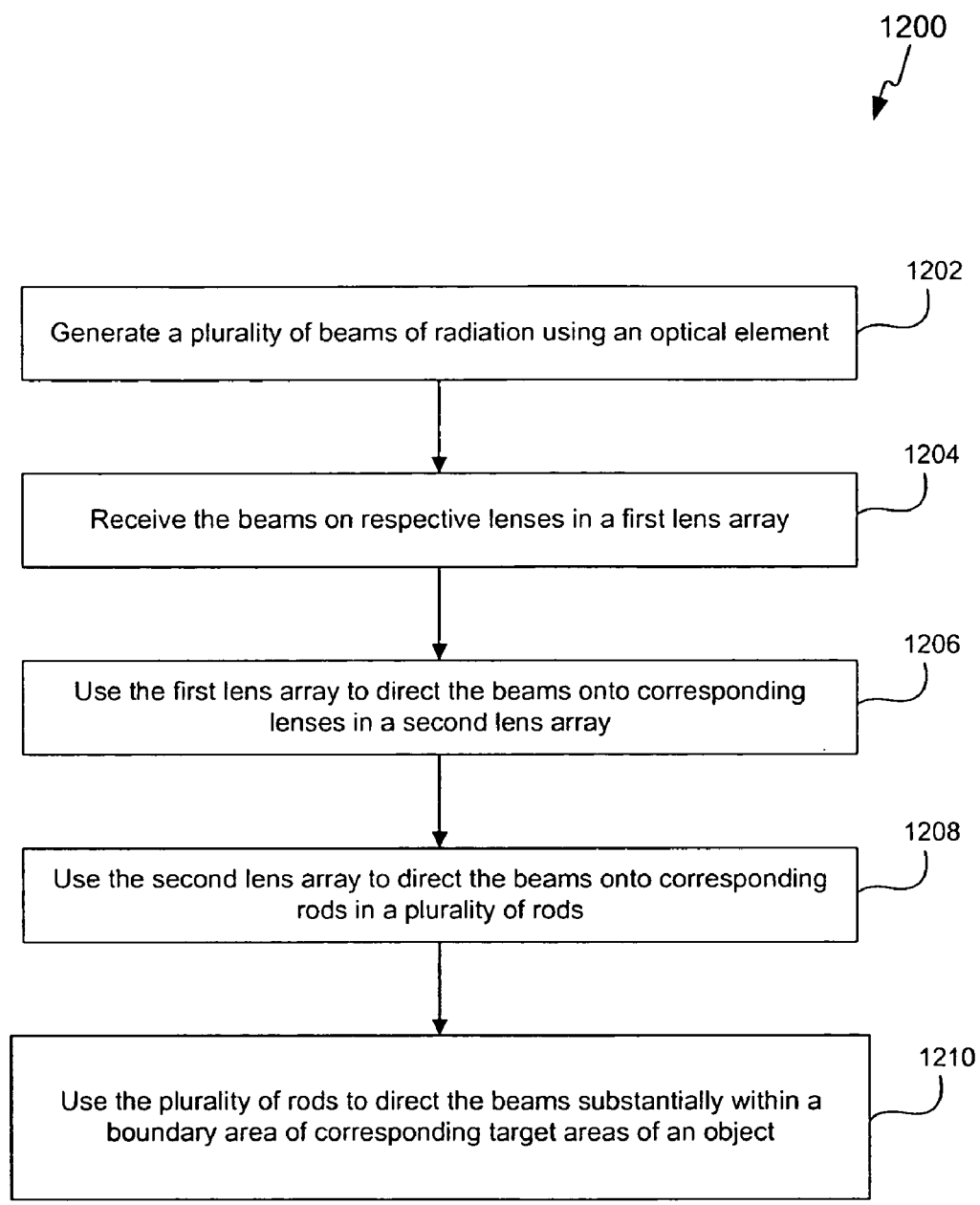
FIG. 12 is a flowchart depicting a method, according to one embodiment of the present invention.

FIG. 12 is a flowchart depicting a method 1200, according to one embodiment of the present invention. In step 1202, a plurality of beams of radiation are generated using an optical element. In step 1204, the beams are received on respective lenses in a first lens array. In step 1206, the first lens array is used to direct the beams onto corresponding lenses in a second lens array. In step 1208, the second lens array is used to direct the beams onto corresponding rods in a plurality of rods. The plurality of rods correspond in number and arrangement to lenses in the second lens array. In step 1210, the plurality of rods are used to direct the beams substantially within a boundary of corresponding target areas of an object. The object includes a plurality of the target areas. The plurality of target areas correspond in number and shape to a number and a cross-sectional shape of the rods in the plurality of rods.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An optical system, comprising:
   an optical element that receives a beam of radiation and generates a plurality of beams therefrom;
   a relay comprising first and second lens arrays, each lens in the first lens array receiving a respective portion of the plurality of beams and directing the respective portion onto a corresponding lens in the second lens array;
   a plurality of rods corresponding in number and arrangement to the lenses in the second lens array, each of the rods receiving a beam from the corresponding lens in the second lens array; and
   an object including a plurality of target areas that correspond in number and shape to a number and a cross-sectional shape of the rods, each of the target areas receiving a beam of radiation from a respective rod substantially within a boundary of the target area.

2. The optical system of claim 1, wherein the optical element comprises a diffractive or refractive optical element.

3. The optical system of claim 1, wherein the first and second lens arrays comprise fly's eye lens arrays.

4. The optical system of claim 1, wherein each rod comprises a glass rod.

5. The optical system of claim 1, wherein each rod comprises a hollow rod having reflective interior walls.

6. The optical system of claim 1, wherein the relay is arranged to demagnify an image between the optical element and the plurality of rods.

7. The optical system of claim 6, wherein a first cross-section of the image that exits each lens in the first lens array is larger than a second cross-section of the image that enters each lens in the second lens array.

8. The optical system of claim 1, wherein:
   the object comprises a patterning device; and
   the target areas comprise active areas of the patterning device.

9. The optical system of claim 8, wherein:
   the patterning device comprises an array of individually controllable elements; and
   each of the individually controllable elements includes one of the active areas.

10. The optical system of claim 1, wherein the relay is arranged to maintain double telecentricity of the plurality of beams.

11. The optical system of claim 1, wherein the first and second lens arrays comprise microlens arrays.

12. The optical system of claim 1, wherein substantially an entire entrance face of each of the rods is illuminated with the beam from the corresponding lens in the second lens array.

13. The optical system of claim 1, wherein the relay creates an image of the optical element on a plane of entrance of the plurality of rods.

14. The optical system of claim 1, wherein an entrance face of each rod in the plurality of rods is partially illuminated with the beam from the corresponding lens in the second lens array.

15. The optical system of claim 1, wherein each lens in the second lens array directly receives the respective portion of the plurality of beams from the corresponding lens in the first lens array.

16. The optical system of claim 1, wherein each of the rods in the plurality of rods directly receives the beam from the corresponding lens in the second lens array.

17. A method, comprising:
    generating a plurality of beams of radiation using an optical element;
    receiving the plurality of beams on respective lenses in a first lens array;
    using the first lens array to direct the plurality of beams onto corresponding lenses in a second lens array;
    using the second lens array to direct the plurality of beams onto corresponding rods in a plurality of rods, the plurality of rods corresponding in number and arrangement to lenses in the second lens array; and
    using the plurality of rods to direct the plurality of beams substantially within a boundary of corresponding target areas of an object, the object including a plurality of target areas that correspond in number and shape to a number and a cross-sectional shape of the rods in the plurality of rods.

18. The method of claim 17, further comprising using a semiconductor wafer or a flat panel glass substrate as a substrate to be patterned using the object.

19. The method of claim 17, further comprising using active areas of a patterning device as the target areas of the object.

20. The method of claim 17, wherein using the first and second lens arrays demagnifies an image between the optical element and the plurality of rods.

21. The method of claim 17, wherein using the first and second lens arrays maintains double telecentricity of the plurality of beams.

22. The method of claim 17, wherein using the first and second lens arrays creates an image of the optical element on a plane of entrance of the plurality of rods.

23. A system, comprising:
    an optical element configured to generate beams;
    a relay configured to direct the beams from a first lens array to a second lens array, the second lens array having M lenses arranged in X columns and Y rows of an arrangement, M, X, and Y being positive integers;
    M rods arranged in X columns and Y rows, each of the M rods receiving a beam from a corresponding lens from the M lenses, X columns, and Y rows of the second lens array; and
    M target areas arranged in X columns and Y rows and having a cross-sectional shape of the M rods, each of the target areas receiving a beam of radiation from a respective rod substantially within a boundary of the target area.

* * * * *